United States Patent
Irving et al.

(10) Patent No.: US 7,616,025 B1
(45) Date of Patent: Nov. 10, 2009

(54) PROGRAMMABLE LOGIC DEVICE ADAPTED TO ENTER A LOW-POWER MODE

(75) Inventors: Kenneth Irving, Austin, TX (US);
Vishal Aggrawal, Fremont, CA (US);
Prasad Karuganti, Newark, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/928,428

(22) Filed: Oct. 30, 2007

Related U.S. Application Data

(62) Division of application No. 11/838,827, filed on Aug. 14, 2007.

(51) Int. Cl.
*H03K 19/173* (2006.01)
(52) U.S. Cl. .............................. 326/38; 326/39; 326/47
(58) Field of Classification Search ............. 326/39–41, 326/46, 47; 716/16
See application file for complete search history.

(56) References Cited

U.S. PATENT DOCUMENTS

| | | | | |
|---|---|---|---|---|
| 5,430,641 | A * | 7/1995 | Kates ........................ | 363/133 |
| 5,751,164 | A * | 5/1998 | Sharpe-Geisler et al. ...... | 326/38 |
| 6,154,047 | A * | 11/2000 | Taguchi ...................... | 326/30 |
| 6,637,017 | B1 * | 10/2003 | Brophy ....................... | 716/16 |
| 6,653,860 | B2 * | 11/2003 | Agrawal et al. .............. | 326/41 |
| 6,864,708 | B2 * | 3/2005 | Takahashi et al. ............ | 326/33 |
| 7,142,009 | B1 * | 11/2006 | Watt et al. .................... | 326/38 |
| 7,305,259 | B1 * | 12/2007 | Malone et al. ............... | 455/574 |
| 7,498,835 | B1 * | 3/2009 | Rahman et al. .............. | 326/38 |

OTHER PUBLICATIONS

Examiner is notified of office communication (Mail date Oct. 28, 2008) associated with co-pending U.S. Appl. No. 11/838,827 entitled "Programmable Logic Device Adapted to enter a Low-Power Mode" filed Aug. 14, 2007 in which the above identified US Patents are cited.
Spartan-3 Generation FPGA User Guide:http://direct.xilinx.com/bvdocs/userguides/ug331.pdf, Xilinx, Inc., Apr. 2, 2007, pp. 1, 481-500, San Jose, CA, USA.
CoolRunnerll Family Datasheet, http://direct.xilinx.com/bvdocs/publications/ds090.pdf, Xilinx, Inc., Mar. 8, 2007, pp. 1, 7-8, San Jose, CA, USA.

(Continued)

*Primary Examiner*—James H. Cho
*Assistant Examiner*—Crystal L Hammond
(74) *Attorney, Agent, or Firm*—Lewis and Roca LLP

(57) ABSTRACT

A programmable logic integrated circuit device adapted to enter a low-power mode is described. The integrated circuit device includes a programmable logic block, a first low-power mode control circuit programmed into a portion of the programmable logic block, a second low-power mode control circuit, and a low-power enable input coupled to the first low-power mode control circuit and the second low-power mode control circuit. This arrangement allows the programmable logic integrated circuit device to transition into and out of low-power mode in response to a single signal from system control logic, so that the system control logic can be designed without detailed understanding of the inner workings of the programmable logic integrated circuit device or its programmed design.

11 Claims, 9 Drawing Sheets

OTHER PUBLICATIONS

"Cyclone III FPGAs—Optimized for Low Power," http://www.altera.com/products/devices/cyclone3/overview/power/cy3-power.html#silicon_optimizations, Altera Corporation, circa Mar. 19, 2007, 3 pages, San Jose, CA, USA.

"Delivering the World's First Low-Cost 65-nm FPGAs," http://www.altera.com/products/devices/cyclone3/overview/power/cy3-65nm-lowpower.html, Altera Corporation, circa Mar. 19, 2007, 3 pages, San Jose, CA, USA.

"MachX0 Crossover Programmable Logic Devices," http://www.latticesemi.com/products/cpldspld/machxo/index.cfm?jsessionid=ba3026ce5t731$C5$F2$, Lattice Semiconductor Corporation, circa Jul. 18, 2005, 3 pages.

"Sleep Mode Reduces Standby Power to <100 µA," http://www.latticesemi.com/products/cpldspld/machxo/sleepmodereducesstbypowercfm, Lattice Semiconductor Corporation, circa Jul. 18, 2005, 1 page.

"ArcticLink Solution Platform Product Brief," http://www.quicklogic.com/images/QL-ALPB-1.pdf, QuickLogic, Corporation, Feb. 2007, pp. 1, 3, Sunnyvale, CA, USA.

"PolarPro Family Datasheet," http://www.quicklogic.com/images/polarpro_family_DS.pdf, QuickLogic Corporation, original version Feb. 2005, latest version Aug. 2007, pp. 1,35-36, 63, Sunnyvale, CA, USA.

"Minimizing Energy Consumption with Very Low Power Mode in PolarPro FPGAs," QuickLogic® Application Note 88, http://www.quicklogic.com/images/appnote88.pdf, QuickLogic Corporation, Aug. 2006, pp. 1-2, 6, Sunnyvale, CA, USA.

Copending U.S. Appl. No. 11/928,445 filed, Oct. 30, 2007 entitled Programmable Logic Device Adapted to Enter a Low-Power Mode.

* cited by examiner

PROGRAMMABLE LOGIC DEVICE ADAPTED TO ENTER A LOW-POWER MODE

CROSS-REFERENCE TO RELATED APPLICATIONS

This application is a divisional of co-pending U.S. patent application Ser. No. 11/838,827, filed Aug. 14, 2007, which is hereby incorporated by reference as if set forth herein.

BACKGROUND OF THE INVENTION

1. Field of the Invention

The invention pertains to the field of integrated circuits. More particularly, the invention pertains to programmable logic integrated circuit devices adapted to enter a low-power mode.

2. Description of Related Art

Programmable logic integrated circuit devices (PLDs) are known in the art. A PLD comprises any number of programmable elements and their associated control elements. Programmable elements are building blocks used to construct the various design elements of a complete design specified by the end user. Examples of programmable elements are logic modules capable of implementing a variety of Boolean functions, flip/flops, routing interconnect wires, input buffers, output buffers, and complex functional blocks such as static random access memories (SRAMs) and digital multipliers. Often a programmable element requires multiple control elements to specify its use and function. The programmable elements are initially uncommitted until a control data structure (which may also be called control data or programming data or bit stream data) is stored in the control elements.

The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the programmable elements can vary greatly and must be appropriate for the type of control element used.

Like most integrated circuits, PLDs typically have an input/output (I/O) ring surrounding a central core, though other approaches are possible. The I/O ring contains the input and output buffers that interface to circuits external to the PLD as well as the power supply and ground connections. Some of the input and output buffers are typically dedicated to control functions. Others are programmable elements which can be part of an end user's complete design. It is common for the programmable element inputs and outputs (also called user inputs or user input buffers and user outputs or user output buffers) to pair equal numbers of input buffers and output buffers together to form input/output buffers (also called I/O buffers or user I/O buffers or user I/Os or sometimes simply I/Os). In some PLDs, one or more of the inputs, outputs, or I/Os can be shared between user design functions and control functions.

Like most integrated circuits, PLDs are typically sold inside a protective enclosure called a package, though other approaches may be used. The package protects the PLD from physical damage and chemical contamination as well as providing a reliable means for safely mounting the PLD on a printed circuit board in the end user's electronic system (sometimes known as an application). The package has a number of external conductive leads (sometimes called pins). The mounting process typically involves soldering the pins to conductive traces disposed on the printed circuit board. In some applications where a less permanent interface is desired, the package can be placed in a socket mounted on the printed circuit board which holds the PLD securely in place and indirectly couples the pins to the conductive traces disposed on the printed circuit board.

Typically the PLD is glued into the center of the floor of a cavity inside the package. The periphery of the cavity is typically lined with bond posts conductively coupled to the external pins. The PLD typically has bond pads located in the I/O ring placed to allow bond wires to couple the bond pads to the bond posts. After the bond wires are placed, the cavity is sealed in a manner appropriate for the type of package used. Thus the PLD is protected while the various inputs, outputs, I/Os, power, and ground connections are conductively coupled to the appropriate package conductive leads and ultimately to the appropriate conductive traces on the printed circuit board in the electronic system.

In a pure PLD, the central core contains a programmable logic block comprising the majority of the programmable elements and control elements. The programmable logic block also typically contains a variety of control circuits. There may be other control circuits present either inside the central core or inside the I/O ring or divided between the central core and the I/O ring. This control circuitry handles various tasks such as testing the PLD functionality, programming the control elements, or transitioning the PLD from one mode of operation to another. In a hybrid PLD, there are typically other function blocks such as central processing units, digital signal processors, custom logic blocks, and large volatile or non-volatile memory blocks. In some cases, the programmable logic block may be a minority of the total central core circuitry.

An end user's PLD design is typically implemented by use of a computer program product (also known as software or, more specifically, design software) produced by the PLD manufacturer and distributed by means of a computer-readable medium such as providing a CD-ROM to the end user or making the design software downloadable over the internet. Typically the manufacturer supplies a library of design elements (also known as library elements) as part of the computer program product. The library design elements provide a layer of insulation between the end user and the circuit details of the programmable elements, control elements, and the other PLD features available to the end user. This makes the design software easier to use for the end user and simplifies the manufacturer's task of processing the end user's complete design by the various tools in the design software.

Library elements can range from the very general to the very specific. An example of a general library element would be a logic module that maps to a programmable element capable of doing any Boolean function of up to four variables depending on the settings of the underlying control elements. When using such a library element, the end user would need to specify the desired Boolean function.

A first example of a specific library element would be a non-varying Boolean function requiring several logic modules to implement. A second example of a specific library element would be an interface to a particular piece of physical hardware. Such a library element could allow the end user to specify a complex functional block like a hardwired, dedicated digital multiplier present on the PLD as part of his design. A third example of a specific library element would be an interface to some aspect of the PLD control logic that would not ordinarily be accessible as part of an end user's pure logic design.

The design software typically provides one or more methods for the end user to specify the necessary design elements to obtain the desired functionality. Typically the user will enter schematics, describe the design in a hardware description language such as Verilog or VHDL, or use some combination thereof. In the case of large, complicated designs, a hierarchy of ever more complex design elements will be built up until the desired functionality is completely described. Then one or more software tools will process the complete design and map the design elements into the programmable elements in the PLD. Then the control data structure necessary for controlling the programmable elements by means of the associated control elements is generated. The method for applying the control data structure to the control elements can vary widely due to both the technology employed, the hardware present on the data processing system running the design software, and design choices made by the end user.

In recent years as integrated circuit process geometries have shrunk into the deep sub-micron range, power consumption has become an increasingly greater problem. This is particularly true in hand-held applications where battery lifetime is of critical importance. Thus PLD manufacturers have started adapting their parts to consume less power. One technique used is to have a low-power mode which is controlled by means of an external low-power mode enable input. This allows the end user's electronic system to place the PLD into low-power mode whenever the functionality implemented in its programmable elements is not needed, thus saving most of the power it would otherwise consume in its normal operating mode. The exact details of power-down mode differ from manufacturer to manufacturer, but most take precautions like blocking or disabling the input buffers to control unnecessary internal switching in response to signal activity on external conductive traces, placing the output buffers into a safe state with respect to the external system, and disabling or placing into a safe state various other features when a signal coupled to the low-power enable input is asserted.

An undesirable aspect of prior art solutions is that the PLD is placed into low-power mode without any regard to the internal state of the end user's design. It is important in many applications to stop the PLD in a deterministic logic state before entering low-power mode. This allows the PLD to resume operation in the exact configuration it was in upon leaving low-power mode. With previous solutions, there is no guarantee that when the low-power enable input is asserted that the logic will stop in a deterministic state.

Users typically work around this problem by placing the PLD internal logic into a deterministic state by means of some external control logic and only then asserting the low-power mode enable input. This requires the use of at least one additional input to the PLD and some knowledge at the system design level of the necessary steps and required timing needed to prepare for a safe assertion of the low-power enable input. This complicates the design of the end user's entire electronic system. Thus, it is highly desirable to have a PLD device that is capable of placing its own internal logic into a deterministic logic state in a manner specified by the end user as part of the complete design programmed into the PLD before placing itself into low-power mode under the control of a single low-power enable input.

DETAILED DESCRIPTION OF THE INVENTION

Figure 1:
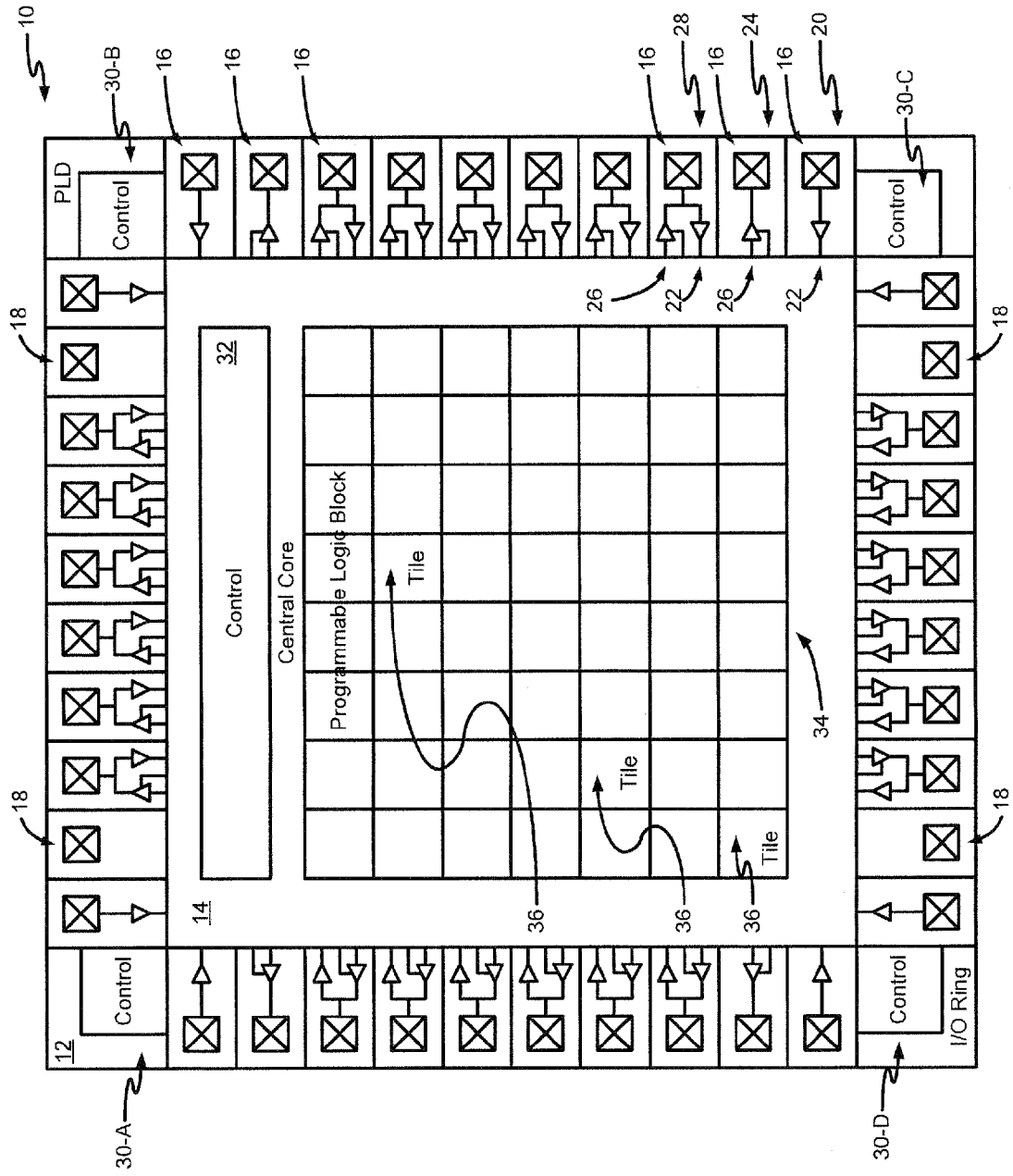
FIG. 1 is a physical block diagram of an illustrative embodiment of a programmable logic integrated circuit device adapted to enter a low-power mode.

Those of ordinary skill in the art will realize that the following description of the present invention is illustrative only and not in any way limiting. Other embodiments of the invention will readily suggest themselves to such skilled persons.

An embodiment of the present invention includes an integrated circuit device adapted to enter a low-power mode. The integrated circuit device includes a programmable logic block, a first low-power mode control circuit programmed into a portion of the programmable logic block, a second low-power mode control circuit, and a low-power enable input coupled to the first low-power mode control circuit and the second low-power mode control circuit. Provision may also be made for a status interconnect coupled between the first and second low-power mode control circuits. The low-power mode enable input may be either a dedicated or a shared input.

An embodiment of the present invention includes an electronic system including a printed circuit board, a first conductive trace disposed on the printed circuit board, a programmable logic integrated circuit device adapted to enter a low-power mode, the integrated circuit being mounted on the circuit board and having a low-power enable input coupled to the first conductive trace, a programmable logic block forming a portion of the circuitry of the programmable logic integrated circuit device, a first low-power mode control circuit programmed into a portion of the programmable logic block, the first low-power mode control circuit being coupled to the low-power enable input, and a second low-power mode control circuit forming a portion of the circuitry of the programmable logic integrated circuit device, the second low-power mode control circuit being coupled to the low-power enable input. Provision may also be made for a status interconnect coupled between the first and second low-power mode control circuits. The low-power mode enable input may be either a dedicated or a shared input.

An embodiment of the present invention includes a method of placing a programmable logic integrated circuit device in a low-power mode by programming a user-specified low-power mode control circuit into a programmable logic block forming a portion of the circuitry of the programmable logic integrated circuit device, signaling the programmable logic integrated circuit device to initiate low-power mode, executing a user-specified low-power mode entry sequence, and executing a manufacturer-specified low-power mode entry sequence is described. Provision is also made for disabling various clocks and the programmable logic block in a deterministic manner. The method may be implemented via a computer program product in a computer-readable medium for use in a data processing system for programming a programmable logic integrated circuit device adapted to enter a low-power mode is described. The computer program product includes first instructions for combining one or more end user-specified design elements and one or more manufacturer-specified design elements into a first low-power mode control circuit to be programmed into a programmable logic block inside the programmable logic integrated circuit device, the first low-power mode control circuit forming a portion of a complete design, wherein the first low-power mode control circuit is coupled to a low-power enable input, the low-power enable input also being coupled to a second low-power mode control circuit, second instructions for mapping the design elements of the complete design into the programmable elements forming a portion of the circuitry of the programmable logic integrated circuit device, and third instructions for generating the control data structure necessary for controlling the programmable elements. Provision may also be made for fourth instructions for applying the control data structure to the control elements in a manner appropriate for the technology being used.

A better understanding of the features and advantages of the present invention will be obtained by reference to the accompanying drawings, which set forth an illustrative embodiment in which the principles of the invention are utilized.

A programmable logic integrated circuit device adapted to enter a low-power mode 10 is shown generally in the physical block diagram in FIG. 1, which shows its main components. As shown in FIG. 1, an illustrative embodiment of the present invention is a PLD 10 that includes an input/output ring 12 at the periphery of the integrated circuit surrounding a central core 14. Persons of average skill in the art will recognize this as the physical layout used for employing most conventional integrated circuit packaging techniques. Such skilled persons will also know that other packaging approaches are possible and that alternate physical dispositions of the components are possible and that this particular illustrative embodiment is in no way limiting.

The I/O ring 12 includes a number of signal bond pads 16, power supply bond pads 18, input cells 20, input buffers 22, output cells 24, output buffers 26, input/output cells 28, and control blocks 30-A, 30-B, 30-C and 30-D. Persons of ordinary skill in the art will appreciate that the numbers and distributions of these various components are a matter of design choice and are illustrative only. For example, while thirty-six signal bond pads 16 and four power supply pads 18 are shown along with a variety of input, output, and input/output cells, many other numbers and combinations can be chosen for the design of a particular PLD. Such skilled persons will also realize that ground is often referred to as a "power supply" and that some of the power supply bond pads 18 will be used for supplying ground to the PLD 10.

The signal bond pads 16 and the power supply bond pads 18 conductively couple the PLD to the end user's electronic system by means of pins. Typically the PLD is glued to the floor of a cavity inside the package. The bond pads 16 are physically placed to allow reliable conductive coupling between the bond pads 16 and 18 and bonding posts inside the cavity of a conventional integrated circuit package by means of bond wires.

Returning to FIG. 1, input cell 20 includes a signal bond pad 16 coupled to the input node of an input buffer 22. Input buffer 22 is a circuit capable of sensing a voltage or current present on the signal bond pad 16 and determining if the voltage or current corresponds to a signal value of logic-1 or logic-0. Output cell 24 includes a signal bond pad 16 coupled to the output node of an output buffer 26. Output buffer 26 is a circuit capable of applying a voltage or current to bond pad 20 so that another circuit outside the PLD 10 can determine if the applied voltage or current corresponds to a signal value of logic-1 or logic-0. If no signaling is desired, output buffer 26 can be placed in a high-impedance output state by means of an output enable signal. Input/output cell 28 includes a signal bond pad 16, an input buffer 22, and an output buffer 26. The signal bond pad 26 is coupled to the input wire of the input buffer 22 and the output wire of the output buffer 26. This arrangement allows both the sensing of externally driven signals and the applying of internally driven signals by means of a single bond pad 16. Alternatively, it allows the flexibility of using a single bond pad 16 as either an input design element, an output design element, or an input/output design element.

A large variety of signaling methods are known in the art. Examples of single-ended signaling methods are TTL, LVTTL, CMOS, LVCMOS, HSTL, and SSTL, while examples of differential signaling methods are LVDS and PECL. Single-ended methods transmit logic-1s and logic-0s along a single conductive trace, while differential methods use two matched conductive traces, one of which caries the signal while the other carries the binary complement of the signal. Each method has its own specification, typically described in a standards document used industry-wide, for the required voltages or currents corresponding to signal values of logic-1 and logic-0. Typically a PLD will support a variety of different signaling methods and the end user will specify the input, output, or input/output buffer as a design element along with the desired method of signaling, and the correct standard will be selected for the input, output, or input/output buffer by means of the programmable elements and the control elements inside the PLD. Only single-ended methods are present in the illustrative embodiment of the present invention and the details of selecting and applying different standards to the input, output, and input/output buffers are not further discussed to avoid unnecessarily complicating the specification and obscuring the inventive elements therein. Persons skilled in the art will appreciate that the signaling methods described herein are illustrative only and in no way limiting.

FIG. 1 also shows control blocks 30-A, 30-B, 30-C, and 30-D present in the four different corners of the PLD 10. Typically the corners of an integrated circuit are good places to put miscellaneous logic that does not logically or physically fit in somewhere else. Control blocks 30-A, 30-B, 30-C, and 30-D may be considered placeholders for this type of logic rather than identical blocks with identical functionality. Persons skilled in the art will appreciate that the actual logic contained in each corner, if any, is a matter of design choice. Such skilled persons will also appreciate that in addition to often being placed in the corners, dedicated control logic is often distributed over the area of a PLD for a variety of reasons including the physical proximity of the control circuit to the circuitry being controlled, the physical size and shape of the block requiring a particular location as a consequence of the physical sizes, shapes, and locations of other blocks, and the physical location of the various wires that the control logic must connect to. It is common for many functions to be placed together in a physical block regardless of the logical relationship between the functions. It is also not uncommon for a single control function to be distributed amongst a number of different control blocks. Sometimes control circuitry is even duplicated in multiple locations or blocks because it is less expensive than having one control circuit wired to circuits located at many distant locations. Sometimes control logic and circuits are distributed inside blocks whose primary functionality has nothing to do with controlling the PLD 10. These various methods of distributing dedicated control logic and the circuits under control are well known in the art.

The central core 14 of the PLD 10 illustrated in FIG. 1 includes a control block 32. Like control blocks 30-A, 30-B, 30-C, and 30-D, control block 32 contains a portion of the complete chip control logic. In an embodiment of the present invention, control block 32 contains most of the control circuitry related to the low-power function. Persons skilled in the art will realize that many distributions of control logic are possible in any given PLD and that the methods and distributions described herein are illustrative only and are in no way limiting.

The central core 14 of the PLD 10 illustrated in FIG. 1 also includes programmable logic block 34, which includes a number of tiles 36. FIG. 1 shows a 7×8 array of tiles, though any number of tiles and array sizes is possible. The tiles contain a variety of programmable elements and control elements, which can be used to build the design elements that form an end user's design. More than one type of tile may be employed. Persons skilled in the art will realize that the numbers and types of tiles employed are a matter of design choice.

Figure 2B:
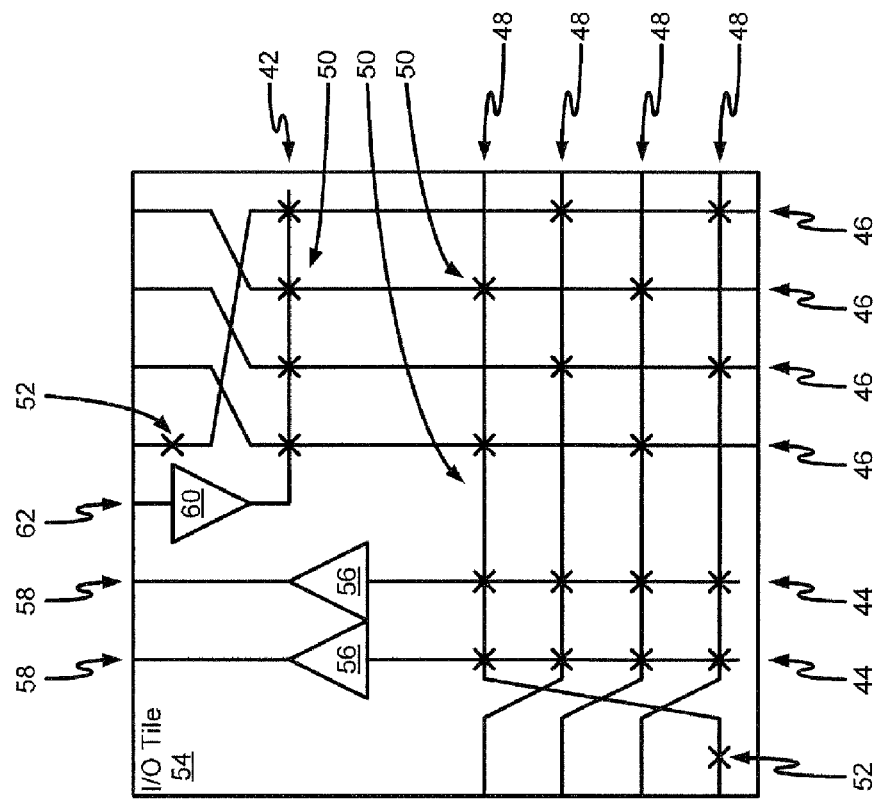
FIG. 2B is a simplified diagram of an illustrative input/output tile that contains many programmable elements and may be used to connect between design elements inside and outside the programmable logic block in the programmable logic integrated circuit device adapted to enter a low-power mode of FIG. 1.
Figure 2A:
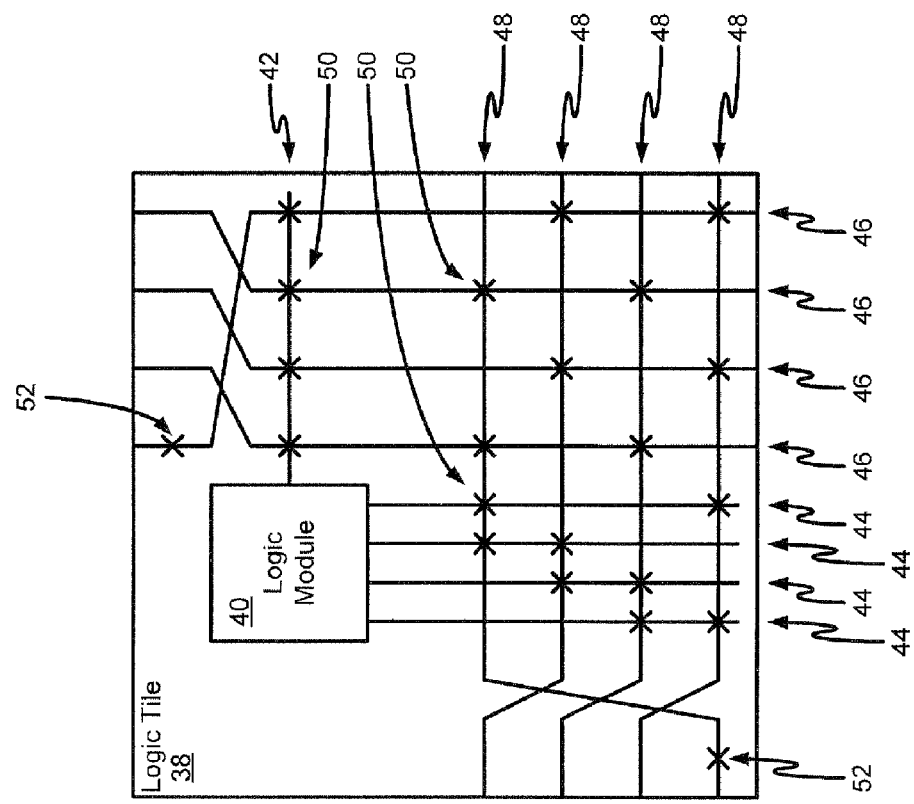
FIG. 2A is a simplified diagram of an illustrative logic tile that contains many programmable elements and may be used to build design elements inside the programmable logic block in the programmable logic integrated circuit device adapted to enter a low-power mode of FIG. 1.

FIG. 2A shows a simplified diagram of an illustrative logic tile 38 that contains many programmable elements and may be used to build design elements in the programmable logic block 34. A logic module 40 is shown coupled to a single output wire 42 and four input wires 44. A large variety of logic modules are known in the art. These include, for example, multiplexer-based logic modules used in the MX, SX, and AX PLD families offered by Actel Corporation of Mountain View, Calif., four input function generators (also known as look-up tables) such as those featured in the various Virtex and Spartan PLD families offered by Xilinx, Inc. of San Jose, Calif. or the 4 input module capable of being a latch, a flip/flop, or any Boolean function of 3 variables in the ProASIC3 PLD family offered by Actel. These and many other logic modules may be used in the PLD of the present invention.

Persons skilled in the art will appreciate that the number of inputs and outputs will vary with the logic module type chosen and the numbers of inputs and outputs shown in FIG. 2A are illustrative only and in no way limiting.

FIG. 2A also shows an illustrative routing interconnect architecture including vertical routing wires 46, horizontal routing wires 48, cross-connect elements 50, and series-connect elements 52. The vertical routing tracks 46 and the horizontal routing tracks are each shown in a configuration known as a twist group. For illustrative purposes, there are four wires shown in each twist group though any number in either group is possible. A twist group is an infinitely repeating routing structure that allows a number of identical tiles to be placed adjacently and each tile will see an identical routing structure in the direction the wires in the twist group travel. In other words, for a vertical twist group of width four each tile will have available to it a first wire extending the length of the tile and further extending three tiles above, a second wire extending from one tile below through the tile and further extending two tiles above, a third wire extending from two tiles below through the tile and further extending one tile above, and a fourth wire extending from three tiles below through the length of the tile. There are precisely two series-connect elements 52 present in FIG. 2A. The rest of the connect elements are cross-connect elements 50 though not all are specifically identified by number to avoid over complicating the figure. The series-connect elements 52 are required to break and extend the twist groups. By connecting two vertical routing wires 46 or horizontal routing wires 48 with a series-connect element 52, a signal can travel another four tiles further in either the vertical or horizontal directions respectively.

All of the cross-connect elements 50 are used to make connections between different types of wires. For example, an output wire 42 can be connected to a vertical routing wire 46, an input wire 44 can be connected to a horizontal routing wire 48, or a vertical routing wire 46 can be connected to a horizontal routing wire 48. Not all intersections of different types of wires are required to have cross-connect elements. The degree of population of these intersections is primarily a matter of the technology used for the programmable element. For example, if the programmable element is an antifuse, which is the size of a via and is embedded in the insulating oxide between metal layers, it is very inexpensive to place a programmable element at every intersection. Persons skilled in the art will recognize that in the case of an antifuse performing a cross-connect element function, the antifuse is also the control element as well as being the programming element. By contrast, if the programmable element is a pass transistor controlled by an SRAM bit control element, then relatively few intersections can be populated and careful choices must be made.

Logic module 40, output wire 42, input wires 44, vertical routing wires 46, horizontal routing wires 48, cross-connect elements 50, and series-connect elements 52 are all examples of programmable elements of the most basic sort. Design elements are made up by combining these and other basic elements that in turn may be combined into larger and more complicated design elements.

Many different routing architectures in a variety of technologies are known in the art. Many, such as the 3000, 4000, and various Virtex SRAM-based PLD families offered by Xilinx, the AX antifuse-based PLD family offered by Actel, and the ProASIC3 flash-based PLD family offered by Actel, include some number of twist tracks of various widths while others, such as the MX and SX antifuse-based PLD families offered by Actel, do not use them at all. All of the above mentioned routing architectures and many others may be used in the PLD of the current invention. The routing architecture in the simplified diagram shown in FIG. 2A is illustrative only and persons skilled in the art will appreciate that the choice of routing architecture in no way limits the present invention.

FIG. 2B shows a simplified diagram of an illustrative I/O tile 38 that contains many programmable elements and may be used to connect between design elements inside and outside the programmable logic block 34. Two out-going buffers 56 are shown, each with an input wire 44 coupled to its input terminal and an out-going wire 58 coupled to its output terminal. A single in-coming buffer 60 with an in-coming wire 62 coupled to its input terminal and an output wire 42 coupled to its output terminal is shown. The two out-going buffers 56 are designed to drive the data and enable inputs of an output buffer 26 while the in-coming buffer 60 is designed to receive a signal from the output of an input buffer 22, though other uses of these buffers is possible. Those skilled in the art will appreciate that other numbers of in-coming and out-going buffers, or even the omission of buffers altogether by shorting input wires 44 to their respective out-gong wires 58 and in-coming wire 62 to output wire 42, is possible and that the numbers of these components shown in FIG. 2B is illustrative only and in no way limiting.

FIG. 2B also shows an illustrative routing interconnect architecture including vertical routing wires 46, horizontal routing wires 48, cross-connect elements 50, and series-connect elements 52. Except for the number of input wires 44, the routing architectures shown in FIG. 2A and FIG. 2B are identical, though it is not required that this be the case. It is also possible to have more than two tiles in the design of programmable logic block 34. For example, there might be a number of hardwired special function blocks like SRAMs or digital multipliers included inside the programmable logic block 34. This might require the creation of a third tile to interface to the special function block. Eliminating unnecessary complications like special function blocks and limiting the routing architecture to two nearly identical tiles makes it simpler to describe the present invention and not obscure the inventive aspects thereof. Persons skilled in the art will realize that more complicated architectures are possible and may be used with the PLD of the present invention and the choice of illustrative routing architectures is not limiting it in any way.

As was the case in FIG. 2A, the output wire 42, input wires 44, vertical routing wires 46, horizontal routing wires 48, cross-connect elements 50, and series-connect elements 52 of FIG. 2B are also examples of programmable elements of the most basic sort. Similarly, out-going buffers 56, output wires 58, in-coming buffer 60, and input wire 62 can also be considered basic programmable elements.

Figure 3:
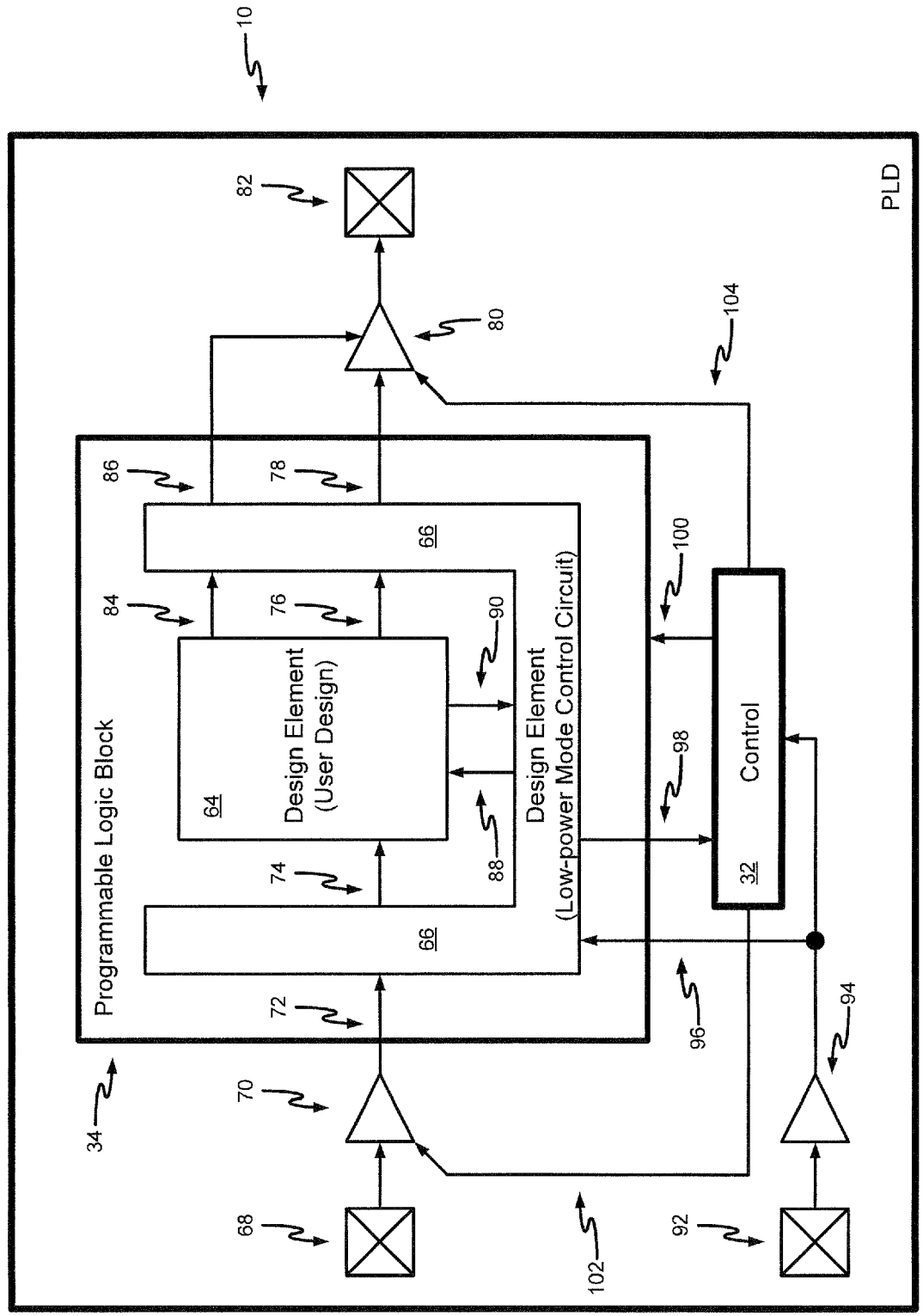
FIG. 3 is a logical block diagram of the programmable logic device of FIG. 1 showing additional details according to an illustrative embodiment of the present invention.

FIG. 3 is a logical block diagram of the programmable logic integrated circuit device adapted to enter a low-power mode of FIG. 1 wherein the representation of PLD 10 is logical rather than physical. As in FIG. 1, the PLD contains control block 32 and programmable logic block 34. Two design elements 64 and 66 are shown inside programmable logic block 34. The design elements are, for example, portions of the programmable logic block 34 programmed by the user to implement specific logic functions. Together design elements 64 and 66 along with the various I/O design elements and the design element portions of the control block 32 make up the end user's complete design. Persons skilled in the art will realize that there could be design elements elsewhere in PLD 10. Such skilled persons will realize that placing them all in control block 32 for purposes of the illustrative embodiment is a simplifying assumption to avoid complicating the specification and obscuring the inventive elements therein and is in no way limiting.

Design element 64 in most cases will be the large majority of the complete design. Design element 66 is the low-power mode control circuit which is shown placed between design element 64 and all of the I/O design elements and control design elements of the complete design. Those skilled in the art will appreciate that there might be reasons for there to be connections between design element 64 and other circuits that do not pass through design element 66 in some complete designs, but those cases will not be discussed to avoid over complicating the specification and obscuring the inventive aspects of the present invention.

In FIG. 3, an illustrative input path comprising input pad 68, user input buffer 70, interconnect 72, and interconnect 74 is shown. Input pad 68 is coupled to the input node of user input buffer 70, the output node of input buffer 70 is coupled to interconnect 72, interconnect 72 is coupled to interconnect 74 through design element 66, and finally interconnect 74 is coupled to design element 64. During normal operation, a signal from outside PLD 10 denoted by a voltage or current change on input pad 68 will be detected and amplified by user input buffer 70 and the detected logic state will propagate through interconnects 72 and 74 to the design element 64. During entry into low-power mode, a low-power mode control circuit of design element 66 can intercept the signal on interconnect 72 and replace it with a different signal on interconnect 74 which is more appropriate to the transition of design element 64 and PLD 10 into low-power mode. For example, the illustrative input path may enable an operation or process that the end user does not want be interrupted during the transition to low-power mode. Design element 66 could monitor the signal on interconnect 72 to allow continuation of an operation that was in progress at the start of the transition into low-power mode, and then prevent the initiation of any further such operations by preventing any further assertions of the enable signal on interconnect 74.

Similarly, FIG. 3 shows an illustrative output path comprising interconnect 76, interconnect 78, user output buffer 80, output pad 82, interconnect 84, and interconnect 86. Design element 64 is coupled to design element 66 by interconnects 76 and 84, interconnects 76 and 84 are coupled to interconnects 78 and 86 respectively through design element 66, interconnects 78 and 86 are coupled to the data input and enable input nodes respectively of output buffer 80, and the output node of buffer 80 is coupled to output pad 82. During normal operation, a signal to be sent outside the PLD 10 will propagate from design element 64 through interconnects 76 and 78, be converted to appropriate voltage or current levels by user output buffer 80 and propagated to output pad 82 from which point it propagates external to the PLD 10. If signaling external to PLD 10 is not desired during normal operation, an output enable signal may be sent by means of interconnects 84 and 86 to user output buffer 80, which places it into a high impedance state where it is unable to affect the current or voltage present on output pad 82. During entry into low-power mode, the low-power mode control circuit of design element 66 intercept the signals on interconnects 76 and 84 and replace them with different signals on interconnects 78 and 86 respectively which are more appropriate to the transition of PLD 10 into low-power mode. For example, the end user may want certain data to be transmitted externally to the PLD during the transition into low-power mode. Design element 66 could manipulate interconnects 78 and 86 to send that data external to PLD 10 prior to the completing the transition into low-power mode.

Interconnect 88 in FIG. 3 is an illustrative interconnect coupling design element 66 to design element 64 and interconnect 90 is in illustrative interconnect coupling design element 64 to design element 66. One purpose for these connections is to allow design element 66 to control design element 64 during the transition into low-power mode and for design element 64 to signal status back to design element 66. Persons skilled in the art will realize that there may be need for more than one signal in each direction, that there may be a need for accomplishing other purposes besides control and status signals, and the choice to show only a single interconnect each direction in the illustrative embodiment is in no way limiting.

FIG. 3 also shows a low-power enable input pad 92 coupled to the input node of low-power enable input buffer 94, and low-power enable interconnect 96 coupling the output node of low-power enable input buffer 94 to both control block 32 and design element 66. A low-power enable signal from outside PLD 10 denoted by a voltage or current change on I/O pad 92 will be detected and amplified by low-power enable input buffer 94 and the detected logic state will propagate through low-power enable interconnect 96 to the control block 32 and design element 66. Thus a single input signal can control a first low-power mode control circuit programmed into programmable logic block 34 and shown as design element 66 and a second low-power control mode control circuit hardwired inside control block 32.

Interconnect 98 in FIG. 3 allows design element 66 to signal its status to control block 32. This allows the low-power mode control circuit in design element 66 to perform the necessary sequence of user-specified tasks to preserve the state of the complete design and shut down certain functions in an orderly manner before the low-power mode control circuit in control block 32 starts executing the necessary sequence of manufacturer-specified functions to disable various hardware functions. For example, if the low-power mode control circuit in control block 32 disables all the clocks, forces the outputs of all logic modules into the logic state optimal for lowest power consumption, or lowers the power supply voltage inside programmable logic block 34, then it might be impossible for the low-power mode control circuit of design element 66 to properly function. Thus it may be necessary to allow the low-power mode control circuit of design element 66 to finish its sequence of tasks before the low-power mode control circuit of control block 32 does anything that compromises the ability of design element 66 to function.

There are a number of different ways that status interconnect 98 might be used. First, design element 66 may be designed to execute its user-specified shutdown sequence to completion in response to an assertion of the low-power enable input signal on input pad 92 while design element 66 instructs control block 32 to wait to begin its shutdown sequence, then design element 66 can signal control block 32 by means of status interconnect 98, and finally control block 32 can execute its manufacturer-specified shutdown sequence.

A second approach to utilizing status interconnect 98 would be to break the manufacturer-supplied shutdown sequence into first and second sub-sequences. Thus in response to an assertion of the low-power enable input signal on input pad 92, design element 66 can execute its user-specified shutdown sequence to completion in parallel with the execution of the first manufacturer-specified sub-sequence, then design element 66 can signal control block 32 by means of status interconnect 98, and finally control block 32 can execute the second manufacturer-specified shutdown sub-sequence. This allows for a faster transition into the low-power state, but the first manufacturer-specified sub-sequence is limited to those tasks that do not compromise the ability of design element 66 to function.

A third approach is to require both the user-specified shutdown sequence and the manufacturer-specified sequence to be self-timed. Thus in response to an assertion of the low-power enable input signal on input pad 92, the manufacturer-specified sequence in control block 32 would guarantee proper operation of programmable logic block 34 and any other key design elements for a specified amount of time before placing it in the low-power state. It would be incumbent on the low-power mode control circuit of design element 66 to finish its user-specified shutdown sequence within the specified amount of time. In this case, there would be no need for status interconnect 98 to be present.

Persons skilled in the art will realize that other approaches are possible and that the illustrative examples above are in no way limiting. For example, both the user-specified shutdown sequence and the manufacturer shutdown sequences could both be broken down into multiple sub-sequences requiring multiple status interconnects running back and forth between design element 66 and control block 32 controlling the process by means of an elaborate series of handshakes.

Control interconnects 100, 102, and 104 are also shown in FIG. 3. Control interconnect 100 couples control block 32 to the programmable logic block 34, allowing the low-power mode control circuit inside control block 32 to place programmable logic block 34 into a low-power state. The exact nature of the low-power state will vary greatly with the architecture of programmable logic block 34, the semiconductor manufacturing process, and the various target applications for the PLD 10. The exact steps taken in any given programmable logic block 34 in no way limit the present invention. Examples of steps that might be taken are to disable all of the sequential elements so they hold state, to disable all of the clock distribution networks, to force the outputs of all logic modules into the logic state optimal for lowest power consumption, or to lower the power supply voltage inside programmable logic block 34 to reduce leakage current.

Control interconnect 102 couples control block 32 to illustrative user input buffer 70 allowing it to be placed in a low-power state by the low-power mode control circuit in control block 32, for example by blocking the connection of user input buffer 70 to input pad 68 to make it non-responsive to the switching of external signals that might be present on input pad 68 during low-power mode or by forcing the output of user input buffer 70 into the logic state optimal for lowest power consumption. In addition to preventing any switching power, controlling the input buffer state allows placing input buffer 70 into its lowest power static state to minimize leakage.

Control interconnect 104 couples control block 32 to illustrative user output buffer 80 allowing it to be placed in a low-power state by the low-power mode control circuit in control block 32. Depending on the state of programmable logic block 34 during low-power mode, the logic values on interconnects 78 and 86 may not be correct for controlling user output buffer 80 in low-power mode. Thus control interconnect 104 can override the logic values on interconnects 78 and 86 and place user output buffer 80 into a state specified by either the user or the manufacturer. In addition to preventing any switching power, controlling the output buffer state allows placing output buffer 80 into its lowest power static state to minimize leakage. Examples of controlling the output buffer state are to drive output pad 82 to logic-1, to drive output pad 82 to logic-0, or to place user output buffer 80 into a high impedance state so that it is incapable of driving output pad 82 at all. In the high impedance case, there are typically some signal conditioning options available such as to pull output pad 82 weakly to logic-1, to pull output pad 82 weakly to logic-0, or to connect a weak latch to output pad 82 so that it remains in whatever logic state it was in prior to user output buffer 80 being placed in high impedance mode. Persons skilled in the art will realize that many possibilities for placing the input and output buffers into low-power states are possible and the examples cited here are illustrative only and in no way limiting.

In the illustrative embodiment in FIG. 3 it is possible every circuit shown except for control block 32 and low-power enable input buffer 94 is disabled in some way once a low-power mode is reached. Thus it is the low-power mode enable circuit in control block 32 that bears primary responsibility for returning the circuits inside PLD 10 to normal operation when a de-assertion of the low-power enable signal on low-power enable input pad 92 is detected and amplified by low-power enable input buffer 94 and propagated to control block 32 by means of low-power enable interconnect 96. Once a de-assertion of the low-power input enable is detected, the low-power mode enable circuit in control block 32 will begin a manufacturer-specified sequence of tasks reactivating the various circuits, for example, by means of control interconnects 100, 102, and 104. Once programmable logic block 34 becomes active again, the low-power mode control circuit inside design element 66 will become active, detect the de-assertion of the low-power enable input on low-power enable interconnect 96, and begin a user-specified sequence of tasks to return design element 64 and its inputs and outputs to normal operation.

Figure 4:
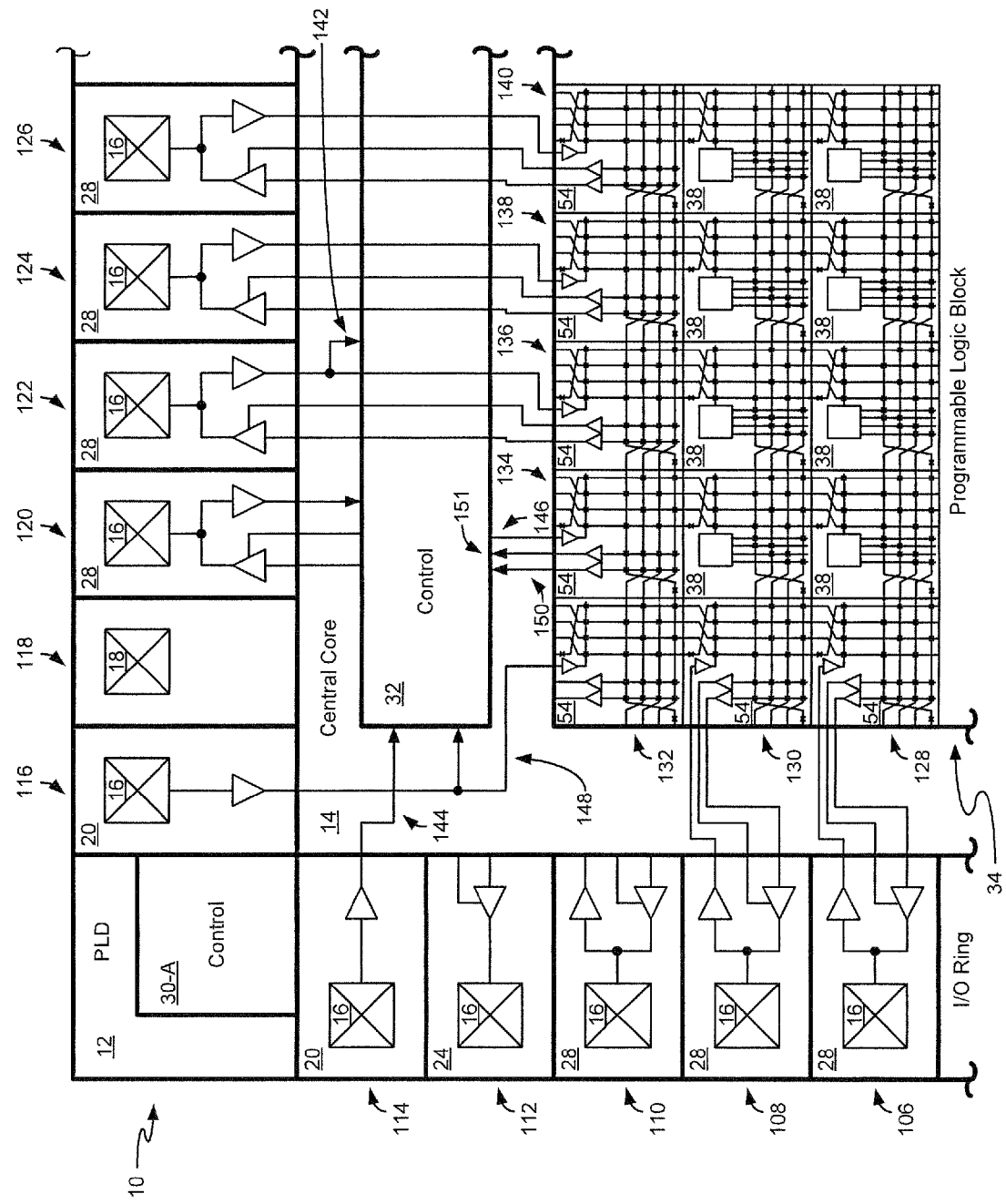
FIG. 4 is a physical block diagram of a portion of the programmable logic device of FIG. 1 showing additional details according to an illustrative embodiment of the present invention.

Turning now to FIG. 4, we find illustrated a physical block diagram of the upper-left portion of the PLD 10 from FIG. 1 showing additional details. Wherever identification numbers are the same in FIG. 4 as in a preceding diagram, they refer to the same element or structure previously described. Whenever a second identification number points at a numbered and previously described element or structure, it is to specifically distinguish that element or structure from other instances of that same element or structure. Present in FIG. 4 are a portion of the I/O ring 12 and a portion of the central core 14. Shown in the portion of the I/O ring 12 are I/O cells 106, 108, 110, output cell 112, input cell 114, control block 30-A, input cell 116, power supply pad cell 118, and I/O cells 120, 122, 124, and 126. Shown in the portion of the central core 14 are a three row by five column portion of the programmable logic block 34 and a portion of the control block 32.

The portion of programmable logic block 34 shown contains a mixture of logic tiles 38 and input/output tiles 54 in place of the generic tiles 36 of FIG. 1. Input/output tiles 54 are arranged around the periphery of programmable logic block 34 and are labeled 128, 130, 132, 134, 136, 138, and 140. All of the rest of the tiles shown are logic tiles 38 which are arranged in the non-periphery locations in the array.

The input/output cells 28 designated as 106, 108, 122, 124, and 126 in FIG. 4 are illustrative user I/O design elements available to the end user as part of his complete design. They are paired with and coupled to the I/O tiles 54 designated as 128, 130, 136, 138, and 140 respectively to provide external access to the internal routing architecture of programmable logic block 34. In all five of these pairings, the two output lines 58 (numbers shown in FIG. 2B only) from I/O tile 54 are coupled to the data and enable inputs of the output buffer in the associated input/output cell 28 and the input line 62 (numbers shown in FIG. 2B only) into I/O tile 54 is coupled to the output of the input buffer in input/output cell 28.

Interconnect 142, which couples between the input buffer of input/output buffer cell 122 and I/O tile 136 also couples to control block 32. This arrangement is known as a shared input. The input buffer of input/output buffer cell 122 can be used as a user input buffer (or the input portion of a user input/output buffer) as part of the user's design, or it can be used as an input to the control logic contained inside control block 32, or both. Since the input buffer of input/output buffer cell 122 can drive both circuitry programmed into programmable logic block 34 by means of the input line to I/O tile 136 as well as circuitry inside control block 32, the signal pad 16 inside input/output buffer cell 122 could perform the function of the low-power enable input pad 92 in FIG. 3, and interconnect 142 could perform the same function as low-power enable interconnect 96 in FIG. 3. One characteristic typical of a shared input is that there must be some way to disable the control logic it is connected to, most likely by means of a control element, when the shared input is used as a regular input and the control logic function is unwanted. This will prevent unwanted control functions from occurring inadvertently as the shared input switches.

Interconnect 144 couples the output of the input buffer in the input cell 20 designated as 114 to the control block 32. This arrangement is known as a dedicated input. Interconnect 144 could not perform the same function as low-power enable interconnect 96 in FIG. 3 because there is no coupling of the signal to programmable logic block 34—unless the signal passes through control block 32 and enters the programmable logic block 34 by another means such as interconnect 146, which couples control block 32 to the input line I/O tile 54 designated as 134. In that case, interconnects 144 and 146 together would illustrate a second way to perform the same function as low-power enable interconnect 96 in FIG. 3, albeit from a different signal pad and input buffer.

Interconnect 148 couples between the output of the input buffer in the input cell 20 designated as 116, the control block 32, and the I/O tile 132. This is also a dedicated input, though topologically in FIG. 4 there is no difference between it and interconnect 142 associated with the shared input described earlier. One characteristic of dedicated inputs is that typically there is no way to disable the control function other than tying the input signal to the de-asserted logic state outside the package, and it is assumed that this is the case for input cell 116 in the illustrative embodiment. Given its topology, interconnect 148 illustrates a third way to perform the function of low-power enable interconnect 96 in FIG. 3, albeit from yet a third signal pad and input buffer.

The distinction between a shared input and a dedicated input can be complex to determine. A fourth way one could perform the function of low-power enable interconnect 96 in FIG. 3 would be to route the low-power enable input signal into programmable logic block 34 by means of the input buffer in any user I/O cell and then route it through the routing architecture to interconnect 150, which couples control block 32 to one of the output buffers 56 in the I/O tile 54 designated as 134. This topology is very different from the previous two cases and will only function correctly if signals can propagate through programmable logic block 34 during low-power mode, but this arrangement is a variant on the shared input case because the signal pad and associated input buffer can be used for either a control purpose, a user input, or both. Persons skilled in the art will realize that other combinations may be possible and in no way limit the scope of the present invention. Ultimately, the true distinction between a shared input and a dedicated input is what the PLD manufacturer's design software allows an end user to do with that particular input.

Interconnect 151 couples the control block 32 to one of the out-going buffers 56 in the I/O tile 54 designated as 134 in programmable logic block 34. This allows a signal from inside the user logic to communicate with the control circuitry inside control block 32. Thus interconnect 151 could serve the function of interconnect 98 in FIG. 3. I/O tile 54 designated as 134 in FIG. 4 along with interconnects 146, 150 and 151 illustrate that I/O tiles 54 provide input/output capability for programmable logic block 34 as well as for PLD 10, even though in most instances they are typically paired with and coupled to input/output cells 28 in the I/O ring 12.

Figure 5:
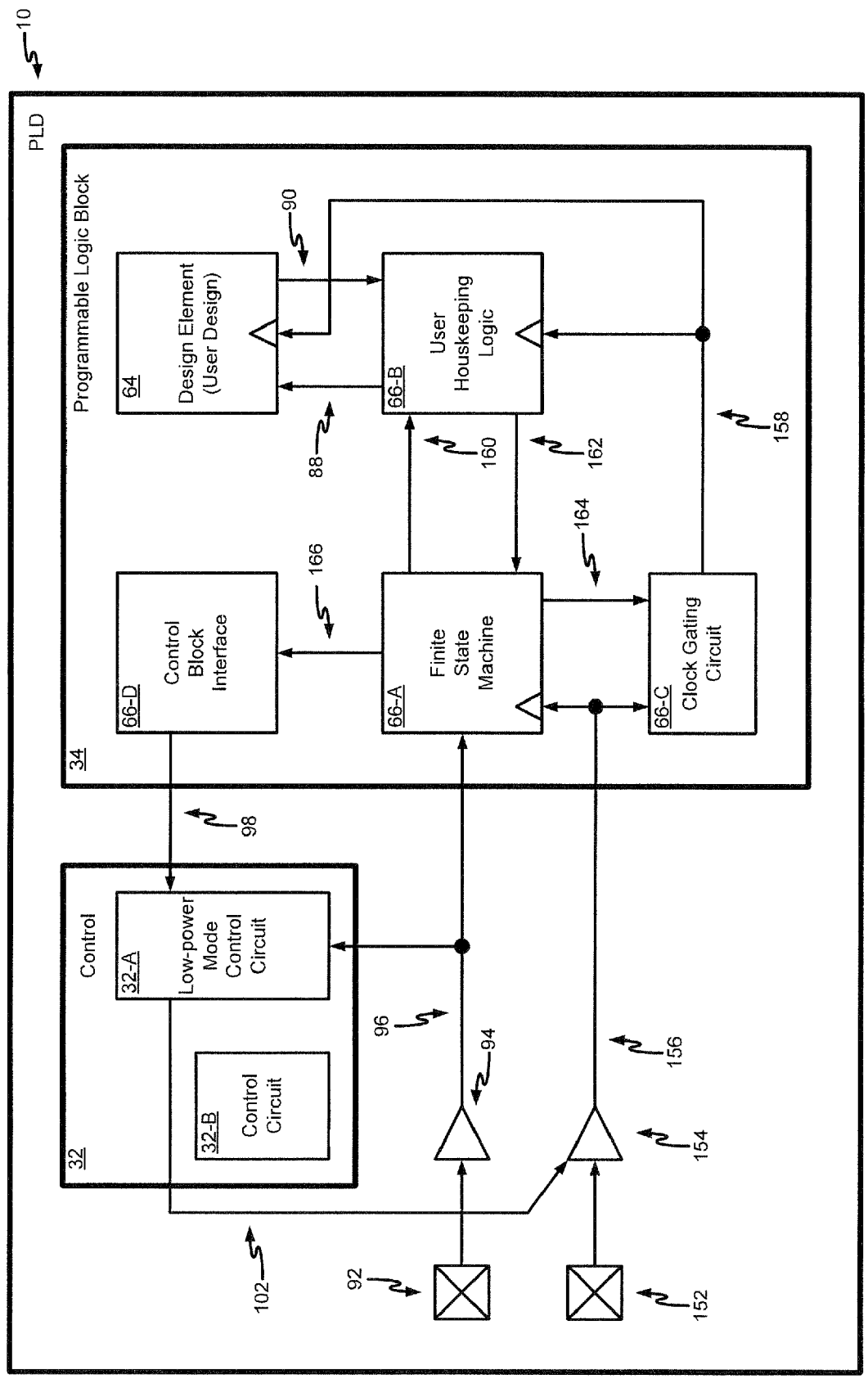
FIG. 5 is a logical block diagram of the programmable logic device of FIG. 1 showing additional details according to an illustrative embodiment of the present invention.

FIG. 5 is a logical block diagram of the programmable logic device adapted to enter a low-power mode of FIG. 1 showing additional details according to an illustrative embodiment of the present invention. In FIG. 5, the structures and elements are arranged logically rather than physically. The illustrative embodiment described is for a low-power mode where programmable logic block 34 remains powered up, where all state elements retain their last logic values, where combinational elements remain responsive to their inputs (even though those inputs remain unchanged during low-power mode), and where all clocks are disabled in programmable logic block 34, in I/O ring 12, or both. Persons skilled in the art will readily realize that a different set of low-power mode features would require a somewhat different approach with regards to some of the details, but that such alternate embodiments are well within the scope of the present invention and do not limit it in any way.

Structures and elements in FIG. 5 that have the same numbers as structures and elements in other diagrams refer to those same structures and elements. Present in FIG. 5 are PLD 10, control block 32 (showing two sub-blocks 32-A and 32-B), programmable logic block 34, design element 64, design element 66 (broken into four smaller design elements 66-A, 66-B, 66-C, and 66-D), interconnects 88 and 90, low-power enable input pad 92, low-power enable input buffer 94, low-power enable interconnect 96, status interconnect 98, and control interconnect 102, which have all been previously described. Also shown in FIG. 5 are main clock input pad 152, main clock input buffer 154, main clock interconnect 156, user logic clock interconnect 158, and start user sequence interconnect 160, user sequence complete interconnect 162, clock stop interconnect 164, and begin low-power mode interconnect 166.

FIG. 5 shows a main clock input pad 152 coupled to the input node of a main clock input buffer 154, and a main clock interconnect 156 coupling the output node of main clock input buffer 154 to finite state machine 66-A and clock gating circuit 66-C inside programmable logic block 34. A main clock input signal from outside PLD 10 denoted by a voltage or current change on main clock input pad 152 will be detected and amplified by input buffer 154 and the detected logic state will propagate through interconnect 156 to finite state machine 66-A and clock gating circuit 66-C.

Control block 32 is shown comprising low-power mode control circuit sub-block 32-A and control circuit sub-block 32-B. Sub-block 32-A contains the circuitry inside control block 32 that is most relevant to the present invention, while sub-block 32-B contains the circuitry that is related to other features of the PLD 10 that are not shown. Persons skilled in the art will realize the simplicity of this arrangement is illustrative only and in no way limiting. For example, there might be some part of PLD 10 that needs to be controlled by both the low-power mode control circuit 32-A and the control circuit 32-B at different times or in different ways. In such a case there might be a sub-block coupled to that circuitry, to low-power mode control circuit 32-A, and to control circuit 32-B.

Attempting to illustrate such a case would unduly complicate the diagrams and specification and obscure the inventive aspects therein.

Design element 66 is shown broken into four smaller design elements: finite state machine 66-A, user housekeeping logic 66-B, clock gating circuit 66-C, and control block interface 66-D. Finite state machine (FSM) 66-A is the main control element of the low-power mode control circuit programmed into programmable logic block 34. FSM 66-A is synchronous to the main clock signal present on interconnect 156. Finite state machine 66-A monitors the state of the low-power enable input signal on interconnect 96. When the low-power enable input is asserted, FSM 66-A cycles through a series of states each corresponding to one or more tasks for entering a low-power mode. While the details will be explained in conjunction with the illustrative state flow chart diagram of FIG. 6, the general process in the illustrative embodiment involves verifying that the assertion of the low-power enable signal is persistent (and not a glitch), signaling the user housekeeping logic 66-B to start the user defined sequence of low-power mode entry tasks by means of interconnect 160, waiting for a signal from the user housekeeping logic 66-B on interconnect 162, signaling the clock gating circuit 66-C by means of interconnect 164 to stop the user logic clock on interconnect 158, signaling the control block interface 66-D by means of interconnect 166 to signal the low-power mode control circuit 32-A inside control block 32 by means of interconnect 98 to disable the main clock input buffer 154 by means of control interconnect 102. Input buffer 154 may be disabled in a deterministic manner to preserve the internal state of FSM 66-A and any other state elements in the user-specified low-power mode enable circuit inside programmable logic block 34, which are clocked by the signal on interconnect 156.

Once the main clock input buffer is disabled and the manufacturer defined sequence of low-power mode entry tasks is complete, PLD 10 has entered low-power mode. The state elements inside FSM 66-A will remain in the last state executed until the low-power mode control circuit 32-A in control block 32 detects a de-assertion of the low-power enable input by means of low-power enable interconnect 96. Once that occurs, the low-power mode control circuit 32-A will enable the main clock input buffer 154. Main clock input buffer 154 should be enabled in a deterministic manner. This will restart the main clock signal on main clock interconnect 156, which will reactivate FSM 66-A, which will signal the clock gating circuit 66-C by means of interconnect 164 to restart the user logic clock on interconnect 158. FSM 66-A will return to the state where it continuously monitors the state of the low-power enable input signal on low-power enable interconnect 96.

In a preferred embodiment, FSM 66-A is a manufacturer-supplied design element, though it is also possible for a user to design some alternate logic that would replace the manufacture's version. Persons skilled in the art will realize that depending on the architecture and technology of PLD 10, that many other tasks might be performed during the various states FSM 66-A transitions through during a low-power mode entry and exit cycle and that many different finite state machines or other logic could be used in the low-power mode control circuit in a programmable logic block in any PLD adapted to enter and exit a low-power mode.

User housekeeping logic 66-B provides the interface between the low-power mode control circuit programmed into programmable logic block 34 and design element 64. User housekeeping logic 66-B will generally be a user-specified design element since each end-user design will have its own requirements and design element 64 will therefore likely be different for each end user design in any PLD. The kinds of tasks that might be performed by user housekeeping logic 66-B include allowing certain critical processes to complete, backing up data or the values of state elements to a memory external to PLD 10, disabling all state elements prior to disabling the user logic clock, and disabling other clocks present in the design by means of additional clock gating circuits like the one shown in design element 66-C. An example of a critical process would be completing the transfer-in-progress of a block of data to another part of the end user's electronic system by emptying the contents of a FIFO through a number of user outputs. An example of backing up data would be transferring the contents of various flip/flops and SRAM blocks to an external flash memory chip and waiting to verify that all of the data was written correctly. It is common for an end user's design to have multiple clock domains each performing a function synchronous to a different clock. An example of disabling each of these clocks in a deterministic manner is disabling the state elements and memory blocks for each clock domain at an appropriate time for the function being performed and then disabling the clocks themselves at an appropriate time using clock gating circuits. Persons skilled in the art will realize that many other functions and tasks are possible within the scope of the present invention and such alternate design choices are in no way limiting of the present invention.

Clock gating circuit 66-C is used to enable and disable the user logic clock on interconnect 158 in a deterministic manner. Assuming that the relevant portion of the user logic in user housekeeping logic 66-B and design element 64 is triggered on the rising edge of the signal on interconnect 158, clock gating circuit 66-C will ensure that the clock will only be enabled or disabled (by being forced to logic-0) during the very beginning of the half of the main clock cycle where the signal on interconnect 156 is at logic-0. This ensures that no abnormally narrow clock high pulses or abnormally narrow clock low pulses are seen on interconnect 158 as a result of being enabled or disabled. The danger of such narrow pulses is that they might be so narrow that either they do not properly propagate to the entire clock network or become so narrow that flip/flops do not properly respond to the clock signal. This sort of non-uniform (and thus potentially non-deterministic) clock behavior could disrupt the saving or preserving in situ of the contents of all the state elements in preparation for or in recovery from low-power mode, which is important in many designs. A state element is a sequential logic circuit containing a binary bit, typically a flip/flop or a latch, whose data must be retained or restored for a logic circuit to begin operation in exactly the same state after a disruption in normal operation such as low-power mode or having the power turned off. Persons skilled in the art will realize that logic can be clocked on both the rising and falling edges of any clock as a matter of design choice. Such skilled persons will also recognize that an alternate circuit to deterministically enable or disable a falling edge active clock can easily be built and that the illustrative choice of a rising edge clock in no way limits the present invention.

Design element 66-C is a manufacturer-supplied design element, though a user designed logic circuit could be used as a substitute if desired. Design element 66-C could be implemented as hard-wired logic located at the inputs to the global clock distribution networks inside programmable logic block 34 or out of logic modules contained in logic tiles 38. Persons skilled in the art will realize that there are multiple ways of generating a deterministic clock gating circuit and the choice presented in the illustrative embodiment of the present invention is in no way limiting.

Control block interface 66-D is a manufacturer-specified design element. In FIG. 5 control block interface 66-D is coupled to FSM 66-A by means of interconnect 166 and to low-power mode control circuit 32-A by means of interconnect 98. In the illustrative example control block interface 66-D does little more than pass the signal on begin low-power mode interconnect 166 to control block 32 by means of interconnect 98, although persons skilled in the art will realize that more complex functionality could be present. Control block interface 66-D may have an input available to the end user and no outputs available to the end user. When the manufacturer's design software combines control block interface 66-D with the other design elements it will properly couple interconnect 166 to interconnect 98 by means of the appropriate programmable elements.

Figure 6:
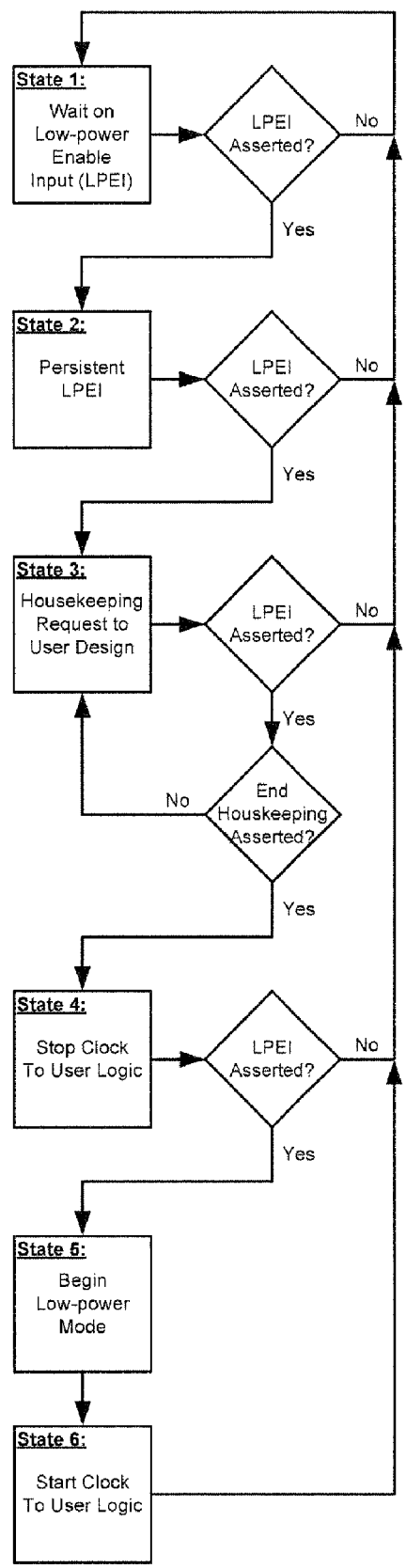
FIG. 6 is an illustrative state flow chart diagram for a finite state machine design element that may be implemented in programmable circuitry in FIG. 5 according to an embodiment of the present invention.

FIG. 6 shows an illustrative state flow chart diagram for a state machine that may be implemented in programmable circuitry. For example, finite state machine design element 66-A may implement the state flow illustrated in FIG. 6 in the low-power mode control circuit inside programmable logic block 34 of FIG. 5. The state flow chart diagram shows six separate states that FSM 66-A can be in. In State #1, FSM 66-A monitors the state of the low-power enable input (abbreviated LPEI in the diagram and hereafter) on interconnect 96. If assertion of the LPEI is detected, FSM 66-A transitions to State #2. State #2 confirms that LPEI is still asserted. This allows FSM 66-A to filter out glitches on the LPEI signal on interconnect 96 without disturbing the operation of design element 64. If assertion of LPEI is not detected by State #2, a glitch is assumed and FSM 66-A returns to State #1. If assertion of LPEI is detected by State #2, then FSM 66-A transitions to State #3.

In State #3, the tasks associated with placing illustrative PLD 10 into low-power mode are initiated. Upon entering State #3, FSM 66-A signals user housekeeping block 66-B by means of start user sequence interconnect 160 to start the user-defined sequence of tasks programmed into design element 66 that are required for low-power mode entry. The amount of time this can take depends on the design of user housekeeping block 66-B. Thus the decision tree for State #3 is more complicated than the other states, since it must monitor both the state of LPEI and the state of the task complete signal on interconnect 162. As long as LPEI remains asserted and the task complete signal remains de-asserted, FSM 66-A will remain in State #3.

When a task complete signal is asserted (assuming LPEI remains asserted), FSM 66-A transitions to State #4, which signals the clock gating circuit 66-C to stop the user logic clock on interconnect 158. This causes all logic and switching inside design elements 66-B and 64 associated with interconnect 158 to cease.

Assuming LPEI is still asserted, then FSM 66-A transitions to State #5 which completes the transition to low-power mode by signaling the control block interface 66-D to signal the low-power mode control circuit 32-A to disable the main clock input buffer 154. At this point, FSM 66-A remains in State #5 for the duration of low-power mode since the main clock is disabled.

After a period of time determined, for example, by the design of the end user's electronic system, LPEI will be de-asserted. This will be detected by the low-power mode control circuit 32-A, which will begin a manufacturer-specified series of tasks to bring PLD 10 out of low-power mode. One of these tasks will be to enable main clock input buffer 154 at the proper time. Once this occurs, the main clock signal will resume on interconnect 156. This will cause FSM 66-A to transition to State #6 to signal the clock gating circuit 66-C to restart the user logic clock on interconnect 158 in this embodiment. No decision based on monitoring LPEI is necessary since de-assertion of LPEI is assumed or the transition to State #6 would never occur.

FSM 66-A transitions back to State #1, where it waits and watches for another assertion of LPEI. Again, in this example, no decision is necessary since de-assertion of LPEI one clock cycle earlier is assumed or the transition to State #6 would never have occurred.

Figure 7A:
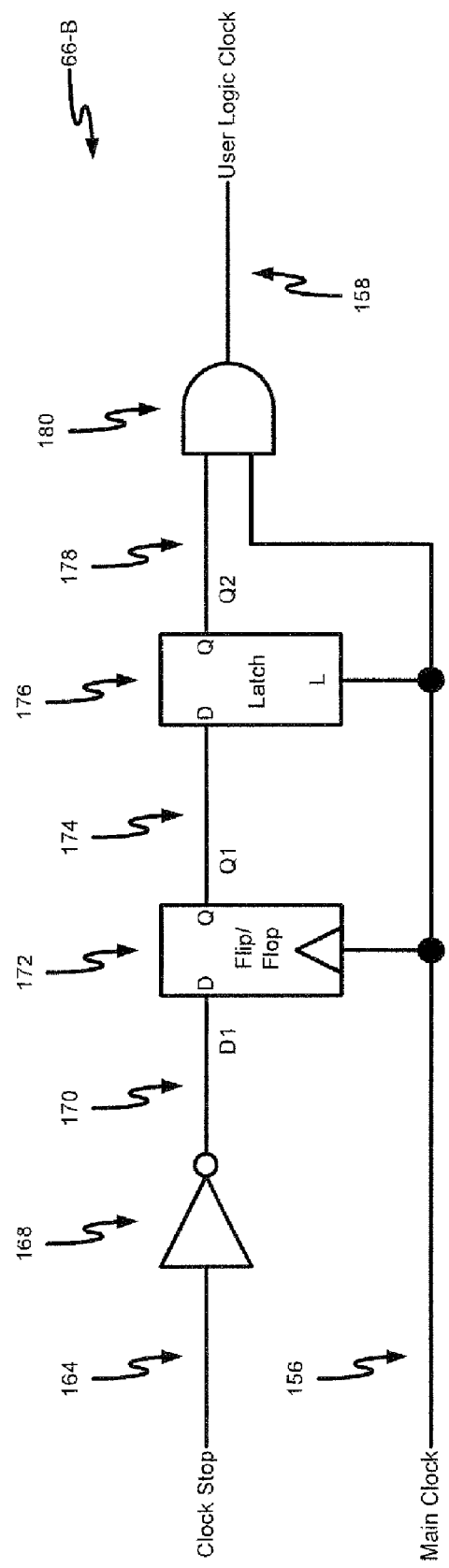
FIG. 7A is a logic diagram of a clock gating circuit that may be used in the programmable low-power mode control circuit of FIG. 3 and FIG. 5 according to an embodiment of the present invention.

FIG. 7A is a logic diagram showing an example of a clock gating circuit that may be used as design element 66-C in the programmable low-power mode control circuit 66 of FIG. 3 and FIG. 5. Turning to the figure, inverter 168 has an input node coupled to clock stop interconnect 164 and an output node coupled to D1 interconnect 170. Flip/flop 172 has a D-input coupled to D1 interconnect 170 and a Q-output coupled to Q1 interconnect 174. Latch 176 has a D-input coupled to Q1 interconnect 174 and a Q-output coupled to Q2 interconnect 178. AND-gate 180 has a first input coupled to Q2 interconnect 178 and an output coupled to user logic clock interconnect 158. Main clock interconnect 156 is coupled to the clock input of flip/flop 172, the L-input of latch 176, and a second input to AND-gate 180.

Flip/flop 172 is rising-edge triggered, meaning whenever a logic-0 to logic-1 transition occurs on the clock input, the data present on the D-input is stored in the flip/flop and becomes available at the Q-output. Latch 176 is level-sensitive with an active-high L-input, meaning that whenever a logic-0 is present on the L-input the data at the D-input passes directly through the latch and becomes available at the Q-output. Whenever a logic-1 is present on the L-input, the value at the Q-output is saved inside the latch and the value at the D-input is ignored. Inverter 168 performs a logic inversion, meaning that whatever signal is presented to its input node causes the logical compliment of that signal to be present on the output. AND-gate 180 performs a logical AND operation on the logic values at its two inputs, meaning that whenever both inputs are at logic-1 the output will be at logic-1 and that whenever a logic-0 is present on either one or both of the two inputs the output will be at logic-0.

Figure 7B:
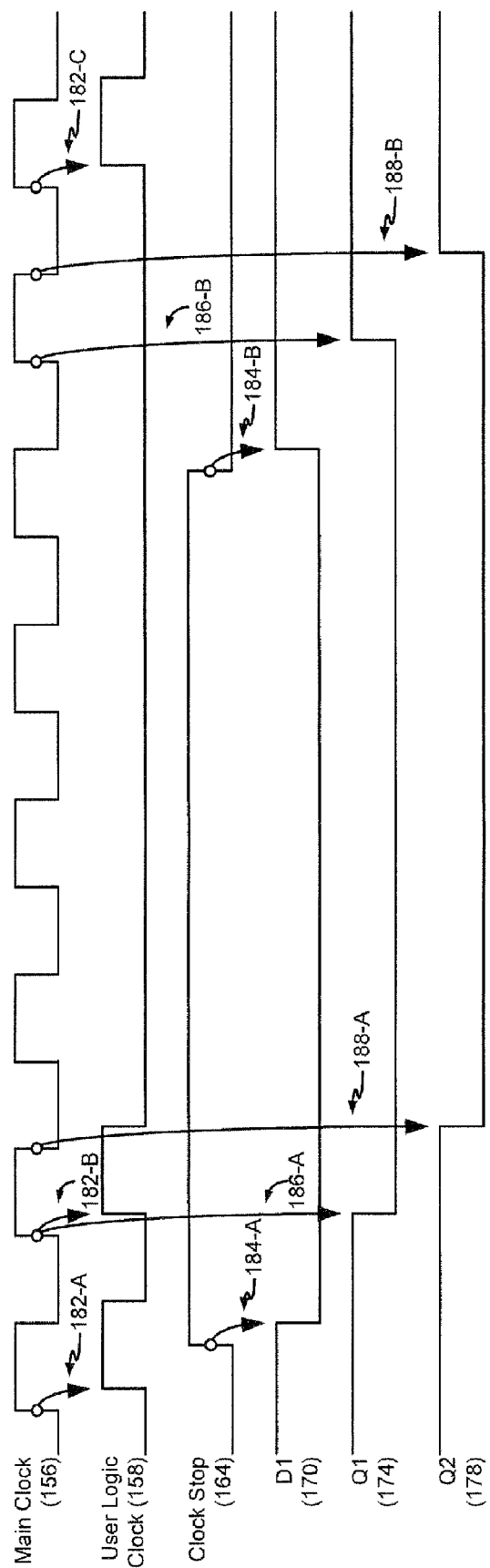
FIG. 7B is a first timing diagram of the clock gating circuit of FIG. 7A according to an embodiment of the present invention.

FIG. 7B is a timing diagram illustrating the general operation of the clock gating circuit of FIG. 7A. The logic levels of main clock interconnect 156, user logic clock interconnect 158, clock stop interconnect 164, D1 interconnect 170, Q1 interconnect 174, and Q2 interconnect 178 are shown versus time. In the diagram, time moves forward from left to right, logic-1 is signified by the uppermost logic level of each waveform, and logic-0 is signified by the lowermost logic level of each waveform.

In FIG. 7B, the main clock interconnect 156 is shown as a constantly running clock. When main clock interconnect 156 switches with the user logic clock enabled, a delayed version of the waveform on main clock interconnect 156 appears on user logic clock interconnect 158 delayed by the propagation delay of AND-gate 180 as indicated by arrows 182-A, 182-B and 182-C. When the logic value changes on clock stop interconnect 164, it is inverted by inverter 168 and driven onto D1 interconnect 170 as indicated by arrows 184-A and 184-B. At the next rising edge of the signal on main clock interconnect 156, the data on D1 interconnect 170 is clocked into flip/flop 172 and driven onto Q1 interconnect 174 as indicated by arrows 186-A and 186-B. At the subsequent falling edge of the signal on main clock interconnect 156, latch 176 goes transparent and the data on Q1 interconnect 176 passes through latch 178 and is driven onto Q2 interconnect 178 as indicated by arrows 188-A and 188-B.

Asserting a logic-1 on clock stop interconnect 164 will disable the user logic clock signal on user logic clock interconnect 158. This causes the assertion of logic-0 on D1 interconnect 170, Q1 interconnect 174, and Q2 interconnect 178 at the times indicated by arrows 184-A, 186-A and 188-A. An assertion of logic-0 on Q2 interconnect 178 forces the output of AND-gate 180 to be driven to logic-0 which blocks the signal on main clock interconnect 156 from propagating onto user logic clock interconnect 158. Flip/flop 172 ensures that Q1 interconnect 174 only changes immediately following the rising edge of the signal on main clock interconnect 156 and that data on Q1 interconnect 174 remains stable for an entire clock period. This ensures that latch 176 can only go transparent and propagate a signal onto Q2 interconnect 178 immediately following the falling edge of the signal on main clock interconnect 156. Thus clock gating circuit 66-C ensures that the last clock period before disabling the user logic clock will have a clock high pulse that is substantially half a clock period in duration followed by a clock low pulse that is substantially half a clock period in duration on user logic clock interconnect 158.

Asserting a logic-0 on clock stop interconnect 164 will enable the user logic clock signal on user logic clock interconnect 158. This causes the assertion of logic-1 on D1 interconnect 170, Q1 interconnect 174, and Q2 interconnect 178 at the times indicated by arrows 184-B, 186-B and 188-B. An assertion of logic-1 on Q2 interconnect 178 allows the output of AND-gate 180 to propagate the signal on main clock interconnect 156 onto user logic clock interconnect 158. Flip/flop 172 ensures that Q1 interconnect 174 only changes immediately following the rising edge of the signal on main clock interconnect 156 and that data on Q1 interconnect 174 remains stable for an entire clock period. Again, this ensures that latch 176 can only go transparent and propagate a signal onto Q2 interconnect 178 immediately following the falling edge of the signal on main clock interconnect 156. Thus clock gating circuit 66-C ensures that the first clock period after enabling the user logic clock will have a clock high pulse that is substantially half a clock period in duration followed by a clock low pulse that is substantially half a clock period in duration on user logic clock interconnect 158.

Figure 7C:
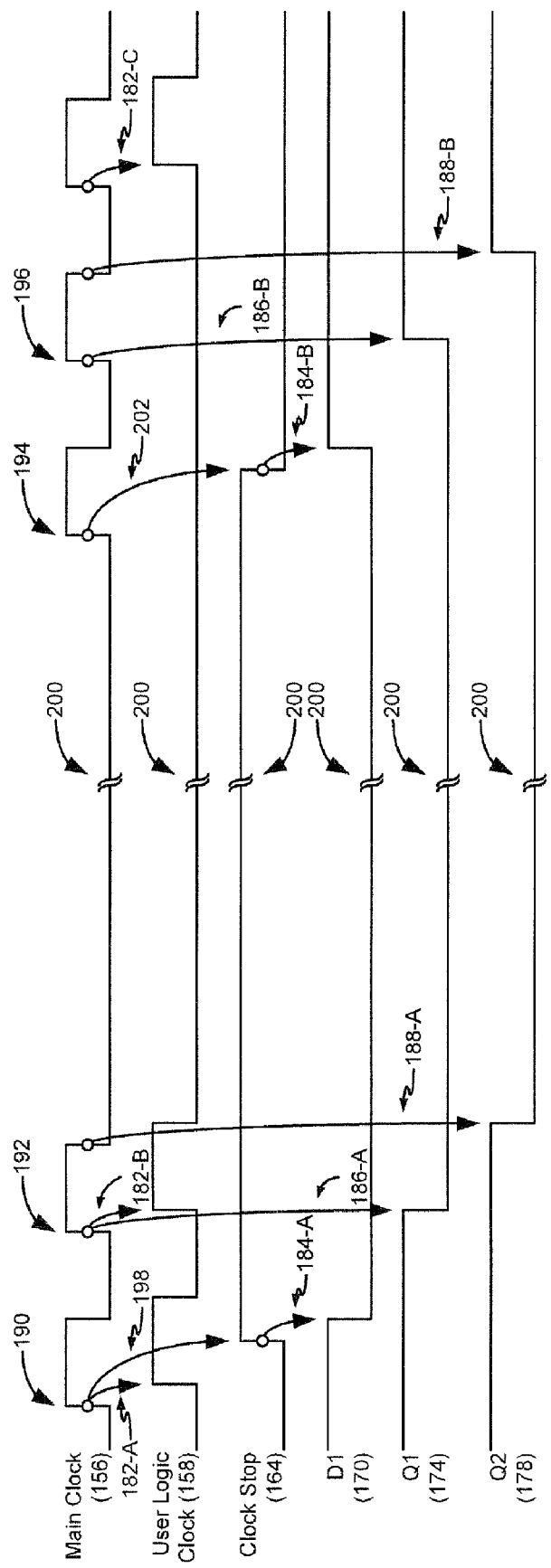
FIG. 7C is a second timing diagram of the clock gating circuit of FIG. 7A according to an embodiment of the present invention.

While FIG. 7B illustrates the general operation of clock gating circuit 66-C, the input waveforms are inconsistent with the operation of FSM 66-A in the illustrative embodiment previously described. FIG. 7C demonstrates the operation of clock gating circuit 66-C in the illustrative embodiment of the present invention. Four different rising edges of the signal on main clock interconnect 156 are labeled 190, 192, 194, and 196. These correspond to the clock edges when FSM 66-A transitions into State #4, State #5, State #6 and State #1 respectively in the illustrative state flow chart diagram of FIG. 6.

Rising edge 190 causes the transition of FSM 66-A into State #4 which stops the user clock. This directly initiates the assertion of logic-1 on clock stop interconnect 164 as indicated by arrow 198 in FIG. 7C which will begin the process of disabling the user logic clock signal on user logic clock interconnect 158 which operates just as it did in FIG. 7B.

Rising edge 192 causes the transition of FSM 66-A into State #5 which begins low-power mode by signaling the control block interface 66-D by means of begin low-power mode interconnect 166 to signal the low-power mode control circuit inside control block 32 by means of interconnect 98 to disable the main clock input buffer 154 while simultaneously causing the assertion of logic-0 on Q1 interconnect 174. Since State #5 disables main clock input buffer 154, there are no further clock pulses on main clock interconnect 156 until the end of low-power mode at some future time determined, for example, by the design of the end user's electronic system. This indefinite amount of time in low-power mode is indicated by the break symbols 200 in the waveforms in FIG. 7C.

When low-power mode ends, the low-power mode control circuit inside control block 32 enables the main clock input buffer 154 which causes clock pulses to resume on main clock interconnect 156. Rising edge 194 causes FSM 66-A to transition into State #6 which starts the user logic clock on user logic clock interconnect 158. This directly initiates the assertion of logic-1 on clock stop interconnect 164 as indicated by arrow 202 in FIG. 7C which will begin the process of enabling the user logic clock signal on user logic clock interconnect 158 which operates just as it did in FIG. 7B.

Finally, rising edge 196 causes the transition of FSM 66-A into State #1 where it waits until the next assertion of the low-power enable input 92.

In general, PLD manufacturers supply an elaborate software suite, often known as design software, to allow end users to make use of the PLDs they sell. The software is provided in a computer readable medium such as one or more CD-ROMs, one or more DVD-ROMs, or by making it downloadable by means of the internet. The design software runs on a data processing system, sometimes known as a design system, which is typically a personal computer running either the Windows or Linux operating systems or a workstation running some variant of the UNIX operating system, though the use of other platforms is possible.

Design software allows for convenient programming of illustrative PLD 10. The design software typically has many different tools. Some of them provide means for entering the end user's complete design or parts thereof into the design system. For example, the user may enter schematics, describe the design in a hardware description language (HDL) such as Verilog or VHDL, or use some combination thereof. In complex designs, the end user starts out using small or basic design elements and combines them to create larger design elements of increasing complexity in a hierarchical manner until reaching the top level of the complete design.

Tools are typically provided to allow the complete design or parts thereof to be logically simulated. After simulation, the parts of the design contained in a hardware description language are run through a synthesis tool to convert the HDL format into design elements for further processing. Finally the complete design is converted into a physical netlist. This means creation of a data structure where the design elements are converted into an equivalent design consisting of nothing but function-type programmable elements that are physically available inside PLD 10 and the necessary connectivity information.

Other tools allow the physical netlist of the complete design to be placed and routed. "Placed" means that each of the function-type programmable elements are mapped to a specific physical instance of that function-type programmable element inside PLD 10. Examples of function-type programmable elements would be logic modules, input/output buffers, SRAM blocks, and digital multipliers. "Routed" means the inputs and outputs of the function-type programmable elements are connected to each other by selecting interconnect-type programmable elements in the right physical locations to make the desired connections. Examples of interconnect-type programmable elements would be vertical routing tracks, horizontal routing tracks, cross-connect elements, and series-connect elements.

Once the place and route is done, other tools can be used to analyze the complete design. Such tools might include timing analysis, power analysis, noise analysis, and simulation based on the physical choices made by the place and route software. After performing the necessary analysis, if the end user is not satisfied that his complete design is correct, then he will need to change his design and then repeat the software flow until it is correct.

Once the design is correct, the process of actually programming illustrative PLD 10 can begin. Another software tool analyzes the place and route data and determines the logical state of every control element inside PLD 10. This tool then creates the control data structure necessary to program the PLD. Typically the design software adapts the control data structure to the method of programming selected by the user. Typically adapting the control data structure does not change the value of any of the control elements inside PLD 10. Rather it involves surrounding the control data structure with additional information necessary for the intended programming method or storing it in an appropriate format in a computer-readable medium. Those skilled in the art will realize that there are many different options that an end user might select based upon the programming technology used inside PLD 10, the nature of the design system hardware, and the application of PLD 10 inside the end user's electronic system. Such skilled persons will also realize that the existence or choice made of these options in no way limits the present invention.

Typically the control data structure is stored in some sort of non-volatile memory in the end user's system. A non-volatile memory is one that retains its stored data after its power supply is removed, disabled, or turned off. Examples of a non-volatile memory would be some sort of floating gate transistor based PROM like an EPROM, an EEPROM, or a flash memory chip, or a data file stored on a hard disk drive. For purposes of programming a PLD built with a non-volatile control elements like antifuses or floating gate transistors, the control elements themselves can be the non-volatile memory that stores the control data structure.

By contrast, a volatile memory loses its stored data when its power supply is removed, disabled, or turned off. DRAM chips or SRAM chips would be examples of the most commonly encountered forms of volatile memory. In the case of a PLD built using a volatile technology like SRAM bits as the control elements, there is a need for a non-volatile memory somewhere in the system, since the SRAM control elements need to be initialized whenever the system powers up or whenever else the end user deems a refresh is necessary. Typically this non-volatile memory for an SRAM-based PLD is a PROM located near the PLD that the PLD can control to self-load its own control data structure upon power-up or receiving a refresh request from the system. Other options like combining a flash PROM on the same chip with an SRAM based programmable logic block, combining a flash chip in a multi-chip package with a PLD chip, or storing the data on a hard disk drive or a PROM somewhere else in the system where a controller like a microprocessor can initiate a refresh, are possible. In some systems, these techniques can be used with a PLD implemented in a non-volatile technology. While some of the details are different, this allows the end user's system to be assembled with an unprogrammed non-volatile PLD which is then later programmed by itself or the system.

The hardware in the end user's design system also plays a role in the available programming options. For example, if the design system includes a PROM burner or a PLD programmer, then the control data structure can be directly transferred into the non-volatile memory inside the PROM or PLD (in the case of a PLD using non-volatile technology). If the design system does not have programming hardware or the volume of PLD devices to be programmed exceeds the capacity of the design system programming hardware, which is often the case in mass production since design systems are typically geared more towards prototyping, then another data processing system called a programmer may be employed. Programmers typically have the hardware capability of programming the same design into many PROMs or PLD devices in parallel. If a programmer is to be used, then the control data structure will be adapted to a format appropriate for the programmer and transferred into a second computer readable medium for transfer to the programmer. Typically all of the options available to a design system are available to a programmer which can be adapted to program either PLD devices in a non-volatile technology or a wide variety of PROMs.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of placing a programmable logic integrated circuit device into a low-power mode, the device having a first low-power mode control circuit, a programmable logic block, and a second low-power mode control circuit programmed into the programmable logic block, the method comprising:
providing an off-chip signal to the first low-power mode control circuit and the second low-power mode control circuit to direct the programmable logic integrated circuit device to initiate low-power mode;
executing a low-power mode entry sequence specified by the second low-power mode control circuit in response to the off-chip signal; and
executing a low-power mode entry sequence specified by the first low-power mode control circuit in response to the off-chip signal.

2. The method of claim 1, wherein:
executing the low-power mode entry sequence specified by the second low-power mode control circuit includes placing at least one circuit programmed into the programmable logic block into a state suitable for low-power mode.

3. The method of claim 2, wherein:
executing the low-power mode entry sequence specified by the second low-power mode entry control circuit includes stopping at least one clock signal coupled to at least one circuit programmed into the programmable logic in a deterministic manner.

4. The method of claim 1, wherein:
executing the low-power mode entry sequence specified by the second low-power mode entry control circuit includes stopping at least one clock signal coupled to at least one circuit programmed into the programmable logic in a deterministic manner.

5. The method of claim 1, wherein:
executing the low-power mode entry sequence specified by the first low-power mode entry control circuit includes stopping at least one clock signal coupled to the second user-specified low-power mode control circuit in a deterministic manner.

6. The method of claim 5, wherein:
executing the low-power mode entry sequence specified by the second low-power mode control circuit includes placing at least one circuit programmed into the programmable logic block into a state suitable for low-power mode.

7. The method of claim 6, wherein:
executing the user-specified low-power mode entry sequence includes stopping at least one clock signal coupled to the circuitry programmed into the programmable logic in a deterministic manner.

8. The method of claim 5, wherein:
executing the user-specified low-power mode entry sequence includes stopping at least one clock signal coupled to the circuitry programmed into the programmable logic in a deterministic manner.

9. The method of claim 1, wherein:
the low-power mode entry sequence specified by the second low-power mode enable circuit and the low-power mode entry sequence specified by the first low-power mode enable circuit are initiated substantially simultaneously.

10. The method of claim 1, wherein:
the low-power mode entry sequence specified by the first low-power mode control circuit is initiated by the completion of the low-power mode entry sequence specified by the second low-power mode control circuit.

11. The method of claim 1, wherein:
executing the low-power mode entry sequence specified by the first low-power mode control circuit includes a first sub-sequence and a second subsequence, wherein the first sub-sequence is initiated substantially simultaneously with the initiation of the low-power mode entry sequence specified by the second low-power mode control circuit and the second sub-sequence is initiated following the completion of the low-power mode entry sequence specified by the second low-power mode control circuit.

* * * * *